WITNESSES
Theodore F. Wrobel
James F. Young

INVENTORS
Henry R. Camp
and Emil P. Polivka
BY
C. L. Menzemer
ATTORNEY

United States Patent Office 3,443,168

Patented May 6, 1969

3,443,168

RESIN ENCAPSULATED, COMPRESSION BONDED, DISC-TYPE SEMICONDUCTOR DEVICE

Henry R. Camp, Irwin, and Emil P. Polivka, New Stanton, Pa., assignors to Westinghouse Electric Corporation, Pittsburgh, Pa., a corporation of Pennsylvania Filed July 26, 1966, Ser. No. 567,921

Int. Cl. H01l 5/02, 9/00

U.S. Cl. 317—234 9 Claims

ABSTRACT OF THE DISCLOSURE

This disclosure relates to a resin encapsulated semiconductor device in which a portion of contact members are held in a compressive electrical contact with a semiconductor wafer assembly as a result of having a second portion of the contact members embedded in the resin encapsulation.

This invention relates to semiconductor rectifier devices encapsulated to provide a flat disc-type configuration. More particularly, the invention relates to a low-cost, disc-type rectifier construction especially adapted for use in stacks of series-connected rectifier devices.

As is known, the usual semiconductor power rectifier assembly includes a lower contact member secured to one side of a semiconductor element and having a downwardly-depending threaded stud adapted for insertion into a companion opening in a heat sink. The other side of the semiconductor element is secured to an upper contact member, the element being hermetically sealed between the contact members by means of a cylindical ceramic insulator.

While rectifier devices of the type described above are used extensively, they are not readily adaptable for applications where it is necessary to connect a number of such devices together in a series stack to increase the overall voltage handling capability. That is, they are rather bulky items stud-mounted on a relatively large and heavy heat sink and must be interconnected through flexible leads.

Semiconductor rectifier devices have been devised for high voltage stack arrangements wherein the configuration of each rectifier is a flat disc. Such devices consist of a flat semiconductor assembly sandwiched between thin circular sheets of electrical conducting material and surrounded by a ring-shaped ceramic insulator which is bonded to the two circular sheets to form a hermetic seal. The thin circular sheets of electrical conducting material comprise the anode and cathode, respectively, of the rectifier. Consequently, such rectifiers can be assembled end-to-end in a lightweight series stack configuration provided with fins for air cooling.

Although the use of a ceramic insulator between circular sheets of electrical conducting material in a flat disc-type rectifier encapsulation is satisfactory for its intended purpose, such a construction requires that the ceramic be brazed to the electrical conducting material and is very costly, even in production quantities. Furthermore, difficulties are encountered in providing a third electrode, other than the anode and cathode, as is required in controlled rectifier devices.

As an overall object, the present invention provides a new and improved flat disc-type rectifier encapsulation which is materially lower in cost than prior art devices of this type.

Another object of the invention is to provide a disc-type semiconductor device wherein a flat semiconductor assembly is sandwiched between thin circular sheets of electrical conducting material and surrounded by a molded plastic ring support which holds the circular sheets in snug abutting relationship with the semiconductor assembly and forms a hermetic seal therewith.

A further object of the invention is to provide a method for manufacturing a flat disc-type semiconductor device wherein flat sheets of electrical conducting material are placed in abutment with opposite sides of a semiconductor assembly and a ring of thermosetting plastic material formed around the semiconductor device so as to surround and embed flange portions of the sheets which project beyond the edges of the wafer and form a hermetic seal therewith.

In accordance with the invention, a semiconductor assembly is provided including a semiconductive wafer having electrical conducting material bonded to its upper and lower surfaces, contact members secured to the electrical conducting material on either side of the wafer and comprising generally circular diaphragms of electrical conducting material having radially-outwardly extending flange portions which project beyond the edges of the semiconductor assembly, and a ring of permanently formed plastic material surrounding the semiconductor assembly and secured to said radially-outwardly extending flange portions to form a hermetic seal therewith.

In one embodiment of the invention, the radially-outwardly extending flange portions are embedded within the plastic material itself; whereas in an another embodiment, the edges of the circular sheets of electrical conducting material are snapped into suitable slots provided in the plastic insulating ring. In still another embodiment, the plastic ring is formed in two parts, each of which embeds a peripheral edge of an associated one of the sheets of electrical conducting material, the two parts being secured together by means of a snap-action connection.

Preferably, the semiconductor assembly, before encapsulation, is surrounded by a pair of O-ring seals or an equivalent one-piece part for the purpose of centering the semiconductor assembly before molding the plastic insulating ring around its edges, and also to protect the exposed semiconductor assembly from the plastic material during molding.

The above and other objects and features of the invention will become apparent from the following detailed description taken in connection with the accompanying drawings which form a part of this specification, and in which:

FIG. 4 is a cross-sectional view of still another embodiment of the invention wherein the dual O-ring seals of the embodiment of FIG. 1 are replaced by a unitary locating ring of silicone rubber or the like;

Figure 1:
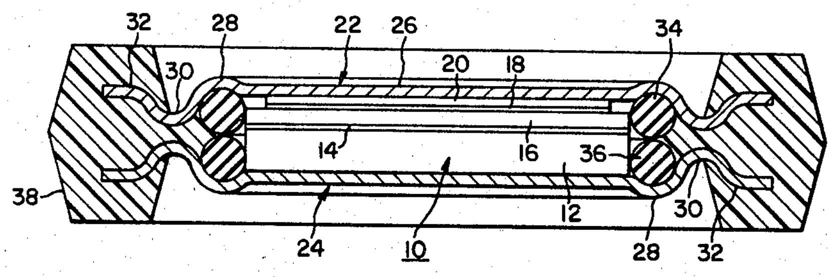
FIGURE 1 is a cross-sectional view of a preferred embodiment of the invention.

With reference now to the drawings, and particularly to FIG. 1, the semiconductor assembly itself is identified by the reference numeral 10 and comprises a lower tungsten disc or electrode 12 having its upper surface covered with a layer 14 of an ohmic solder alloy. Above the alloy layer 14 is the silicon disc 16 itself suitably processed to form a rectifying P-N junction in the conventional manner. Above the disc 16 is a counterelectrode alloy disc 18; and above the disc 18 is a molybdenum disc 20. As will be understood, the particular semiconductor assembly 10 shown herein is illustrative only, the invention being adaptable to any type of flat disc-type semiconductor assembly having electrodes formed on its opposing faces.

Above the semiconductor assembly 10 is a first diaphragm contact 22 pressed into engagement with the molybdenum disc 20. Similarly, a lower diaphragm contact 24 is in abutment with the lower surface of the molybdenum disc 12. Preferably, the contacts 22 and 24 are formed from copper sheet plated on either side with silver or tin; however solid silver discs may be used if desired. Each of the contacts 22 and 24 is stamped to provide a central disc-shaped depressed portion 26 and a surrounding curved annular portion or trough 28. The annular curved portion 28, in turn, is integrally connected to a reversely bent portion 30 which terminates in an annular flange 32.

Between the annular curved portions 28 of the contacts 22 and 24 are a pair of O-ring seals 34 and 36, preferably formed from silicone rubber. The O-ring seals 34 and 36, when positioned in the curved annular portions 28, serve to center the semiconductor assembly 10 between the contacts 22 and 24. With the parts 10, 22 and 24 pressed together as shown, a suitable ring 38, preferably formed from a thermosetting plastic compound, is molded around the assembled parts such that it embeds the flanges 32 on the contacts 22 and 24. Thus, the plastic ring 38 holds the two contacts 22 and 24 in snug abutting relationship with the opposite sides of the semiconductor assembly 10, while the O-rings 34 and 36 serve to center the device 10. The manner in which the plastic ring 38 is formed around the assembled parts will hereinafter be described in detail. It will be noted that the plastic material forms an interface with the outer peripheries of the O-ring seals 34 and 36 which prevent the plastic, before hardening, from coming into contact with the device 10 and causing possible damage.

As was mentioned above, the ring 38 is preferably formed from a thermosetting plastic which will not soften upon the generation of heat which will inherently occur in the rectification process. Any thermosetting plastic can be used which has sufficient strength to hold the parts in assembled relationship and, in general, any substantially monomeric material can be used which is capable of polymerizing to a rigid thermosetting plastic. One specific material which can be used is Type E9405 Thermosetting Epoxy Resin, manufactured by Fibrite Corporation, Winona, Minn.

Figure 2:
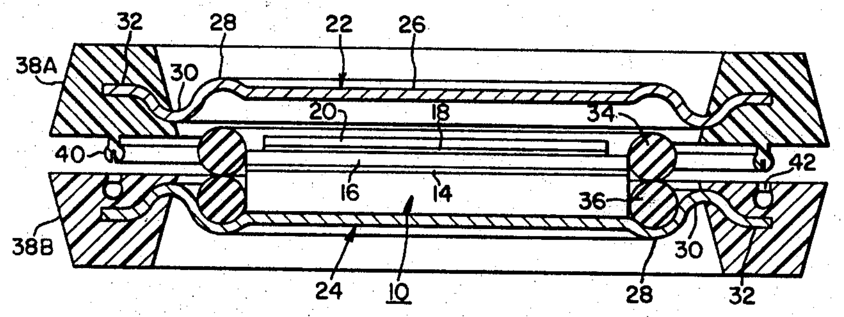
FIG. 2 is a cross-sectional view of an alternative embodiment of the invention wherein the plastic ring surrounding the semiconductor element is formed in two parts which are secured together by means of a snap-action connection.

With reference now to FIG. 2, an alternative embodiment of the invention is shown wherein parts corresponding to those shown in FIG. 1 are identified by like reference numerals. In this case, however, the plastic ring 38 is formed in two parts 38A and 38B. Furthermore, the two parts 38A and 38B must be molded around the peripheral flanges 32 of the contacts 22 and 24 prior to assembly of the device. In order to assemble the device in this case, the O-ring seals 34 and 36 are placed around the semiconductor assembly 10 which is then placed on the lower contact 24. Integrally formed with the upper part 38A is a downwardly-depending annular tongue 40 which fits into a cooperating annular groove 42 in the lower part 38B to effect a snap-action connection. Thus, in assembling the device, the tongue 40 is snapped into the groove 42, thereby bringing the upper diaphragm contact 22 into abutment with the upper surface of the semiconductor assembly 10. If desired, a suitable adhesive may be applied to the mating surfaces of the two parts 38A and 38B before they are snapped together to effect a tight hermetic seal.

Figure 3:
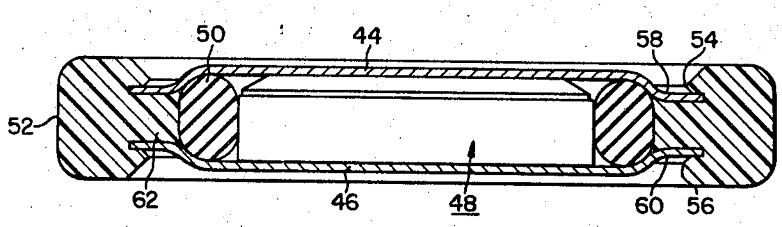
FIG. 3 illustrates an embodiment of the invention wherein the upper and lower circular diaphragm contacts for the semiconductor device are snapped into peripheral slots formed in a soft insulating retainer ring.

In FIG. 3 another embodiment of the invention is shown which again includes disc-shaped upper and lower contact members 44 and 46, respectively, in abutting relationship with the top and bottom surfaces of a semiconductor rectifier assembly 48. In this case, the O-rings of the embodiments of FIGS. 1 and 2 are replaced by a single O-ring seal 50 which surrounds the assembly 48. The two contacts 44 and 46 are held in snug abutting relationship with opposite sides of the assembly 48 by means of a soft insulating retainer ring 52 having dovetail slots 54 and 56 formed on its inner periphery to receive annular flanges 58 and 60 on the diaphragm contacts 44 and 46, respectively. The ring 52 is formed prior to assembly of the device and is provided with a radially-inwardly extending flange portion 62 which abuts the outer periphery of the O-ring seal 50 to hold it securely against the periphery of the semiconductor assembly 48. The ring 52 is again formed from a thermosetting plastic material; however in this case the plastic is preferably softer than that of the embodiments of FIGS. 1 and 2 to permit the flanges 58 and 60 to snap into the dovetail slots 54 and 56.

Figure 4:
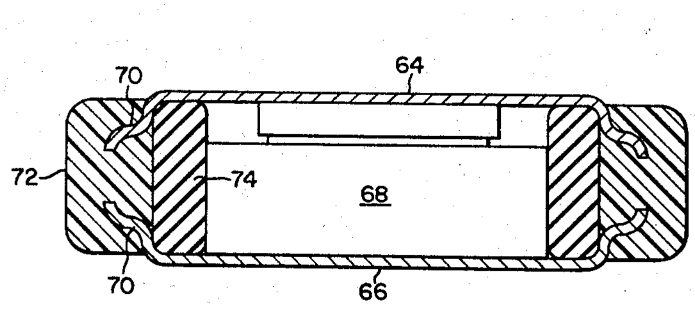

In the embodiment of FIG. 4, diaphragm-type contacts 64 and 66 are again in abutment with the upper and lower surfaces of a disc-shaped semiconductor rectifier assembly 68. Each diaphragm contact 64 and 66 is provided with an inwardly-extending flange portion 70 secured within an epoxy or silicone type resin ring 72 which embeds the flanges 70 as shown. Between the ring 72 and the rectifier device 68 is a locating ring 74 which, in the usual case, comprises a section of silicone rubber tubing. The ring 74, as in the embodiments of FIGS. 1 and 2, serves to center the rectifier device 68 between the two contacts 64 and 66 and to prevent the plastic from coming into contact with the device 68 during molding. This device may be assembled in the same manner as the embodiment of FIG. 1. That is, the silicone rubber ring 74 is slipped over the rectifier device 68; the two contacts 64 and 66 pressed into abutment with opposite sides of rectifier device 68; and the ring 72 thereafter molded around the assembly to embed the flanges 70 and maintain the device in assembled relationship.

Figure 5:
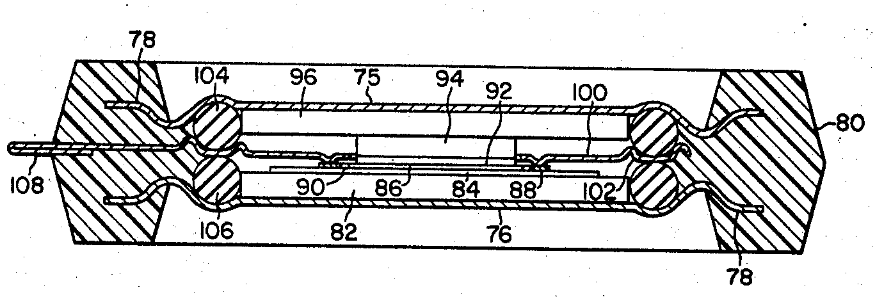
FIG. 5 is an illustration of an embodiment of the invention as applied to a controlled rectifier device incorporating a control electrode as well as a diaphragm-type anode and cathode.

In FIG. 5, the semiconductor device comprises a thyristor (i.e., a semiconductive controlled rectifier). It again includes upper and lower diaphragm contacts 75 and 76 having flange portions 78 embedded within a thermosetting plastic ring 80. The semiconductor assembly between the diaphragm contacts 75 and 76 includes a lower molybdenum disc 82 having a silicon disc 84 secured to its upper surface and comprising the thyristor proper. Above the silicon disc 84 is a central cathode disc 86 surrounded by a gate ring 88. The ring 88 is superimposed over that portion of the silicon disc 84 which is diffused to form the gate electrode of the thyristor. The silicon disc 84 is alloyed to the molybdenum disc 82 to form an alloyed junction as at 90; and above the cathode disc 86 is a silver disc 92. Above the silver disc 92 is a second molybdenum disc 94 and a superimposed copper disc 96, the disc 94 being soldered to the discs 92 and 96. In contact with the gate ring 88 is a circular gate tab 100 having an annular trough portion 102 interposed between O-ring seals 104 and 106. Integrally formed with the gate tab 100 is a projection 108 which extends through the plastic ring 80 for connection to an external circuit. Thus, with the construction shown, the diaphragm contact 76 comprises the cathode of the thyristor, the contact 75 comprises the anode, and tab 108 comprises the gate electrode.

Figure 6:
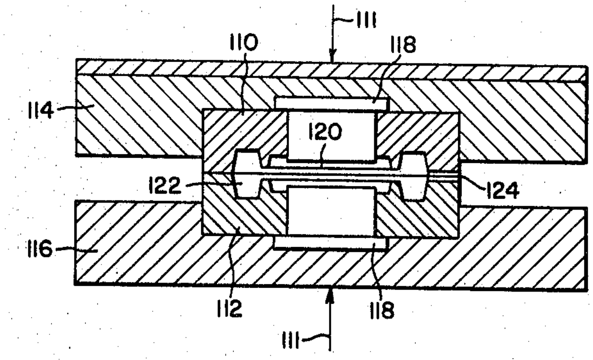
FIG. 6 illustrates the manner in which the device of FIG. 1 is formed.

Apparatus for manufacturing an encapsulated rectifier such as that shown in FIG. 1, for example, is illustrated in FIG. 6. It comprises an upper mold half 110; a lower mold half 112 and pressure plates 114 and 116 for forcing the two mold halves into abutting relationship. Each mold half 110 and 112 is formed with a central opening which receives a solid, cylindrical cavity insert 118.

In order to form the device of FIG. 1, the lower diaphragm contact 24 is placed in the cavity formed by the lower mold half 112 such that the depressed portion 26 rests on the upper surface of the mold insert 118. Thereafter, the semiconductor device is placed on the lower contact, and the two O-ring seals 34 and 36 are slipped over the semiconductor device. The upper diaphragm contact 22 is now placed over the semiconductor device 10 and the upper mold half 110 superimposed over the lower mold half 112. With the pressure plates 114 and 116 in contact with the mold halves 110 and 112, and assuming that forces indicated by arrows 111 are applied tending to press the two mold halves together, the mold inserts 118 will transmit these forces directly to the depressed portions 26 of the diaphragm contacts 22 and 24 shown in FIG. 1, withtout regard to any deflection in the mold halves 110 and 112 due to the cavity formed therein. This insures snug abutting pressure contact between diaphragms 22 and 24 and the device 10. With the aforesaid parts thus placed between the mold halves, the central cavity 120 as shown in FIG. 6 will be filled, while the annular flanges 32 of FIG. 1 on the contacts 22 and 24 will project into the annular cavity 122 formed around the central cavity 120. A suitable thermosetting plastic, in fluid form, is now injected under pressure into the annular cavity 122 through an opening 124 and the plastic allowed to premanently set. Thereafter, the completed device may be removed by separating the two mold halves 110 and 112.

Figure 7:
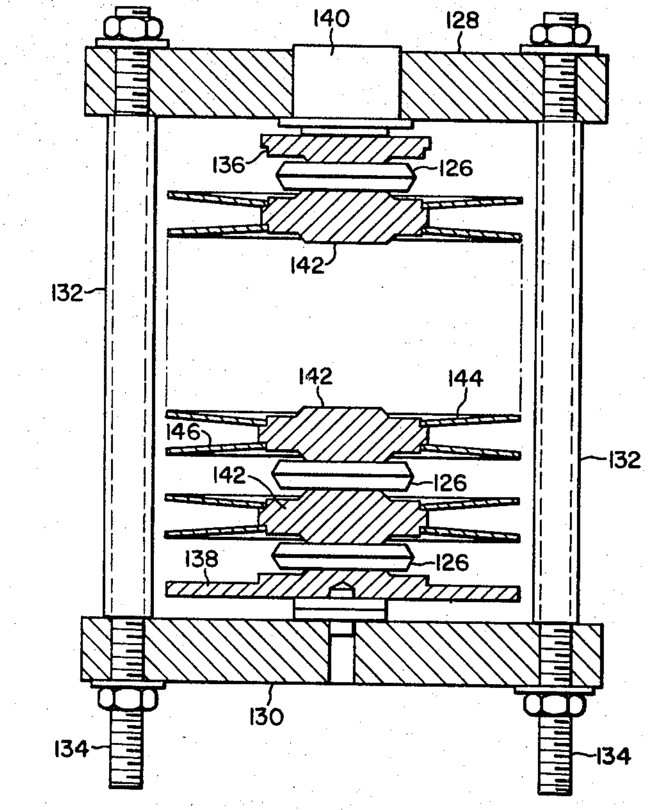
FIG. 7 is an illustration of a stack of disc-type rectifier devices connected in series.

In FIG. 7, a series of encapsulated rectifiers 126 are shown in a stacked assembly wherein the rectifiers are series-connected. The stacked assembly includes an upper plate 128 and a lower plate 130 separated by means of spacer tubes 132 through which tensioning bolts 134 extend in order to draw the two plates 128 and 130 together. The stack of rectifiers 126 is carried between upper and lower heat sink end buttons 136 and 138, respectively. The heat sink end button 138 is securely fastened to the plate 130; whereas a spring assembly 140 on the plate 128 is utilized to urge the heat sink button 136 downwardly as viewed in FIG. 7 to thereby resiliently hold the stack of rectifiers in place. Between adjacent rectifiers are heat sink buttons 142, each provided with upper and lower cooling fins 144 and 146, respectively. Thus, heat generated in the rectification process will flow into the heat sink buttons 142 and thence to the fins 144 and 146 where it is dissipated by circulating air currents.

With the assembly of FIG. 7, the anode of one rectifier is connected to the cathode of the next successive rectifier through an associated heat sink button 142, thereby providing a series string of such rectifiers having greatly increased voltage handling capabilities over those of a single rectifier. The plates 128 and 130 may, for example, be insulated from each other by providing insulating spacer tubes 132 and tensioning bolts 134. With this configuration, the one end plate 128 will comprise the anode of the stack; while the other plate 130 will comprise the cathode.

Although the invention has been shown in connection with certain specific embodiments, it will be readily apparent to those skilled in the art that various changes in form and arrangement of parts may be made to suit requirements without departing from the spirit and scope of the invention. In this respect, it will be appreciated that the construction of the rectifiers shown herein also lends itself to connecting a plurality of such rectifiers in parallel between two suitable heat sinks, either air or water cooled.

We claim as our invention:

1. In combination, a semiconductor assembly comprising a semiconductive wafer and a disc of an electrical conducting material bonded to the upper and lower surfaces of said wafer, contact members in electrical contact with the electrical conducting material on either side of the wafer and comprising generally circular diaphragms of electrical conducting material having radially-outwardly extending flange portions which project beyond the edges of the semiconductor assembly, and a ring of permanently formed plastic material surrounding said semiconductor assembly and secured to said radially-outwardly extending flange portions of the diaphragms to form a hermetic seal therewith, said ring holding, said contact members in compressive electrical contact with said electrical conducting material.

2. The combination of claim 1 wherein said permanently formed plastic material comprises a thermosetting monomeric material capable of polymerizing to a rigid plastic.

3. The combination of claim 1 wherein the semiconductor assembly is circular in configuration and including O-ring seal means surrounding the periphery of the semiconductor assembly and interposed between the semiconductor assembly and said ring of permanently formed plastic material.

4. The combination of claim 1 wherein said ring of permanently formed plastic material comprises upper and lower parts secured together by means of an annular tongue and groove snap-action connection.

5. The combination of claim 1 wherein said ring of permanently formed plastic material is provided on its inner periphery with upper and lower dovetail slots which receive the peripheries of said generally circular diaphragms in a snap-action connection.

6. The combination of claim 1 wherein said semiconductor assembly is circular in configuration, said generally circular diaphragms being stamped to provide annular troughs of arcuate cross section extending around the periphery of the semiconductor assembly, the combination including a pair of superimposed O-ring seals surrounding the semiconductor assembly and compressed between said annular troughs.

7. The combination of claim 6 wherein said O-ring seals are formed from silicone rubber.

8. The combination of claim 1 wherein said semiconductive wafer is doped to provide a thyristor, and including a gate electrode connected to said semiconductive wafer and extending through said ring of permanently formed plastic material.

9. The combination of claim 8 wherein the gate electrode has a generally annular portion in contact with said wafer and an integral radially-outwardly extending tab which extends through said ring of plastic material for connection to an external circuit.

References Cited

UNITED STATES PATENTS

| | | | |
|---|---|---|---|
| 2,876,401 | 3/1959 | Fuller | 317—234.4 |
| 3,222,579 | 12/1965 | Fitzgibbon et al. | 317—234.6 |
| 3,225,416 | 12/1965 | Diebold | 317—234.4 |
| 3,249,829 | 5/1966 | Everett et al. | 317—234.3 |
| 3,257,588 | 6/1966 | Mueller | 317—234.4 |
| 3,310,716 | 3/1967 | Emeis | 317—234.4 |

FOREIGN PATENTS

| | | |
|---|---|---|
| 926,423 | 5/1963 | Great Britain. |
| 975,573 | 11/1964 | Great Britain. |

JOHN W. HUCKERT, *Primary Examiner.*

R. F. POLISSACK, *Assistant Examiner.*

U.S. Cl. X.R.

317—235